(12) United States Patent
Xu

(10) Patent No.: US 11,946,957 B2
(45) Date of Patent: Apr. 2, 2024

(54) SELF-CALIBRATION METHOD FOR SELF-POWERED SINGLE CT CURRENT SENSOR

(71) Applicant: Siemens Aktiengesellschaft, Munich (DE)

(72) Inventor: Shou Qi Xu, Shanghai (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 468 days.

(21) Appl. No.: 17/147,591

(22) Filed: Jan. 13, 2021

(65) Prior Publication Data

US 2021/0215746 A1  Jul. 15, 2021

(30) Foreign Application Priority Data

Jan. 14, 2020 (CN) .......................... 202010037938.6

(51) Int. Cl.
G01R 19/22 (2006.01)
G01R 35/00 (2006.01)
(Continued)

(52) U.S. Cl.
CPC ............ G01R 19/22 (2013.01); G01R 35/005 (2013.01); H02M 1/32 (2013.01); H02M 7/06 (2013.01)

(58) Field of Classification Search
CPC ....... G01R 19/22; G01R 35/005; H02M 1/32; H02M 7/06
See application file for complete search history.

(56) References Cited

U.S. PATENT DOCUMENTS

| 4,437,146 A | 3/1984 | Carpenter |
| 4,847,780 A | 7/1989 | Gilker et al. |

(Continued)

FOREIGN PATENT DOCUMENTS

| CN | 103543319 A | 1/2014 | |
| CN | 106093674 A * | 11/2016 | ............... G01R 1/30 |

(Continued)

OTHER PUBLICATIONS

Extended European Search Report dated May 31, 2021.
U.S. Office Action issued in U.S. Appl. No. 17/147,644 dated Dec. 22, 2021.

Primary Examiner — Minh Q Phan
(74) Attorney, Agent, or Firm — Harness, Dickey & Pierce, P.L.C.

(57) ABSTRACT

In an embodiment, a current sensor unit includes: a rectification module, to convert an AC current to a pulsed DC current; a conversion module containing an energy storage element, to store energy based upon the pulsed DC current during a charging mode and generate a power supply current; a switching module, bypassed by the conversion module during the charging mode, and bypassing the conversion module during an energy release mode; a current sensor module, to detect a pulsed DC current; a control module, to acquire electrical energy from the power supply current, determine operation in the charging mode or energy release mode, and acquire a first detection value provided by the current sensor module; and a self-calibration module, to generate a current flowing through the current sensor module in a self-calibration process, the control module calibrating the first detection value based upon a second detection value of the current generated.

15 Claims, 12 Drawing Sheets

(51) Int. Cl.
*H02M 1/32* (2007.01)
*H02M 7/06* (2006.01)

(56) References Cited

U.S. PATENT DOCUMENTS

| | | |
|---|---|---|
| 5,006,846 A | 4/1991 | Granville et al. |
| 5,532,918 A | 7/1996 | Mayrand et al. |
| 6,232,755 B1 | 5/2001 | Zhang |
| 7,301,347 B2 | 11/2007 | Dearn et al. |
| 7,812,586 B2 | 10/2010 | Soldano et al. |
| 9,423,435 B2 | 8/2016 | Coutelou et al. |
| 2011/0196629 A1 | 8/2011 | Coutelou et al. |
| 2013/0181723 A1 | 7/2013 | Mauder et al. |
| 2016/0139187 A1 | 5/2016 | Horanzy |
| 2017/0030952 A1 | 2/2017 | Shamir et al. |

FOREIGN PATENT DOCUMENTS

| | | |
|---|---|---|
| CN | 106093674 A | 11/2016 |
| CN | 107483047 A | 12/2017 |
| CN | 109683123 A | 4/2019 |
| CN | 208782734 U | 4/2019 |
| CN | 110133356 A | 8/2019 |
| EP | 2960659 A1 | 12/2015 |
| EP | 3023806 A1 | 5/2016 |
| JP | 2002131344 A | 5/2002 |

* cited by examiner

SELF-CALIBRATION METHOD FOR SELF-POWERED SINGLE CT CURRENT SENSOR

PRIORITY STATEMENT

The present application hereby claims priority under 35 U.S.C. § 119 to Chinese patent application number CN 202010037938.6 filed Jan. 14, 2020, the entire contents of each of which are hereby incorporated herein by reference.

FIELD

Embodiments of the invention generally relate to the field of electronic components, in particular to a current sensor unit and a current detection circuit.

BACKGROUND

A current sensor is a detection apparatus, capable of sensing information of a current under test, and capable of converting detected information according to a certain rule into an electrical signal conforming to the requirements of a given standard or into information in another required form for output, in order to satisfy requirements for information transmission, processing, storage, display, recording and control, etc.

At the same time as a current sensor is detecting a current, electronic components of a signal conditioning part require a stable supply of power from a power source. In a conventional solution, an additional power source is generally used to supply power to this portion of electronic components. This additional power source might come from an independent voltage source, or might come from an independent mutual inductor. However, this will make the circuit design complex, with current sensor miniaturization being difficult and costs being high.

FIG. 1 is a schematic diagram of time division multiplexing of a mutual inductor in order to supply power to electronic components in a current sensor in the prior art. In a solution typified by FIG. 1, the mutual inductor is used for supplying power for a period of time, and used for sampling for another period of time. However, this results in current sensor sampling being performed intermittently, and thus a response is not possible in the case of sudden current change events. For example, in the case of application in a power distribution system, it is not possible to detect a short circuit current of a few milliseconds.

FIG. 2 is a schematic diagram of the continuous supply of power to electronic components in a current sensor in the prior art. In a solution typified by FIG. 2, power is supplied continuously to electronic components at a rear end of the current sensor, and a current at the primary side of the mutual inductor is calculated by detecting a current outputted to the rear end by the mutual inductor. However, this is a continuous supply of power, and a voltage-limiting device at the secondary side must be able to tolerate a high power, so power consumption is high. Moreover, a secondary-side DC impedance includes an electronic component equivalent impedance of a non-fixed value, and this has an adverse effect on the linearity of sampling, and will also result in low sampling precision.

SUMMARY

The embodiments of the present invention propose a current sensor unit and a current detection circuit.

At least one embodiment is directed to a current sensor unit, comprising:
 a rectification module, configured to convert an AC current to a pulsed DC current;
 a power source conversion module containing an energy storage element, connected to the rectification module and configured to store energy for the energy storage element based upon the pulsed DC current during operation in a charging mode and to generate a power supply current based upon a voltage of the energy storage element;
 a mode switching module, connected to the rectification module and configured to be bypassed by the power source conversion module during operation in the charging mode, and to bypass the power source conversion module during operation in an energy release mode;
 a current sensor module, connected to the rectification module, the power source conversion module and the mode switching module separately and configured to detect a pulsed DC current flowing back from the power source conversion module or a pulsed DC current flowing back from the mode switching module;
 a control module, configured to acquire electrical energy from the power supply current, determine that operation is in the charging mode or the energy release mode based upon the voltage of the energy storage element, and acquire a first detection value that is provided by the current sensor module and relates to a pulsed DC current; and
 a self-calibration module, configured to generate a predetermined current flowing through the current sensor module in a self-calibration process;
 wherein the current sensor module is further configured to detect the predetermined current; and the control module is further configured to calibrate the first detection value based upon a second detection value that is provided by the current sensor module and relates to the predetermined current.

At least one embodiment is directed to a current detection circuit, comprising:
 a current transformer, containing a primary-side circuit and a secondary-side circuit;
 a current sensor unit, connected to an output terminal of the secondary-side circuit, wherein the current sensor unit comprises: a rectification module, configured to convert an AC current outputted by the secondary-side circuit via the output terminal to a pulsed DC current; a power source conversion module containing an energy storage element, connected to the rectification module and configured to store energy for the energy storage element based upon the pulsed DC current during operation in a charging mode and to generate a power supply current based upon a voltage of the energy storage element; a mode switching module, connected to the rectification module and configured to be bypassed by the power source conversion module during operation in the charging mode, and to bypass the power source conversion module during operation in an energy release mode; a current sensor module, connected to the rectification module, the power source conversion module and the mode switching module separately and configured to detect a pulsed DC current flowing back from the power source conversion module or a pulsed DC current flowing back from the mode switching module; a control module, configured to acquire electrical energy from a power supply current, determine that operation is in the charging mode or the energy release mode based upon the voltage of the energy storage element, and acquire a first detection value that is provided by the current sensor module and relates to a pulsed DC current; a self-calibration module, configured to generate a predetermined current flowing through the current sensor module in a self-calibration process; wherein the current sensor module is further configured to detect the predetermined current; and the control module is further configured to calibrate the first detection value based upon a second detection value that is provided by the current sensor module and relates to the predetermined current.

At least one embodiment is directed to a current sensor unit, comprising:

a rectification module, configured to convert an AC current to a pulsed DC current;

a power source conversion module containing an energy storage element, connected to the rectification module and configured to store energy for the energy storage element based upon the pulsed DC current during operation in a charging mode and configured to generate a power supply current based upon a voltage of the energy storage element;

a mode switching module, connected to the rectification module and configured to be bypassed by the power source conversion module during operation in the charging mode, and configured to bypass the power source conversion module during operation in an energy release mode;

a current sensor module, connected to the rectification module, the power source conversion module and the mode switching module, separately, and configured to detect a pulsed DC current flowing back from the power source conversion module or a pulsed DC current flowing back from the mode switching module;

a control module, configured to
  acquire electrical energy from the power supply current,
  determine that operation is in the charging mode or the energy release mode based upon the voltage of the energy storage element, and
  acquire a first detection value provided by the current sensor module and relating to a pulsed DC current;

a self-calibration module, configured to generate a current flowing through the current sensor module in a self-calibration process;

wherein the current sensor module is further configured to detect the current generated; and wherein the control module is further configured to calibrate the first detection value based upon a second detection value provided by the current sensor module and relating to the current generated.

At least one embodiment is directed to a current detection circuit, comprising:

a current transformer, containing a primary-side circuit and a secondary-side circuit;

a current sensor unit, connected to an output terminal of the secondary-side circuit, the current sensor unit including
  a rectification module, configured to convert an AC current outputted by the secondary-side circuit, via the output terminal, to a pulsed DC current;
  a power source conversion module containing an energy storage element, connected to the rectification module and configured to store energy for the energy storage element based upon the pulsed DC current during operation in a charging mode and configured to generate a power supply current based upon a voltage of the energy storage element;
  a mode switching module, connected to the rectification module and configured to be bypassed by the power source conversion module during operation in the charging mode, and configured to bypass the power source conversion module during operation in an energy release mode;
  a current sensor module, connected to the rectification module, the power source conversion module and the mode switching module, separately, and configured to detect a pulsed DC current flowing back from the power source conversion module or a pulsed DC current flowing back from the mode switching module;
  a control module, configured to
    acquire electrical energy from a power supply current,
    determine that operation is in the charging mode or the energy release mode based upon the voltage of the energy storage element, and
    acquire a first detection value provided by the current sensor module and relating to a pulsed DC current;
  a self-calibration module, configured to generate a current flowing through the current sensor module in a self-calibration process;
  wherein the current sensor module is further configured to detect the current generated; and
  wherein the control module is further configured to calibrate the first detection value based upon a second detection value, provided by the current sensor module and relating to the current generated.

Figure 1:
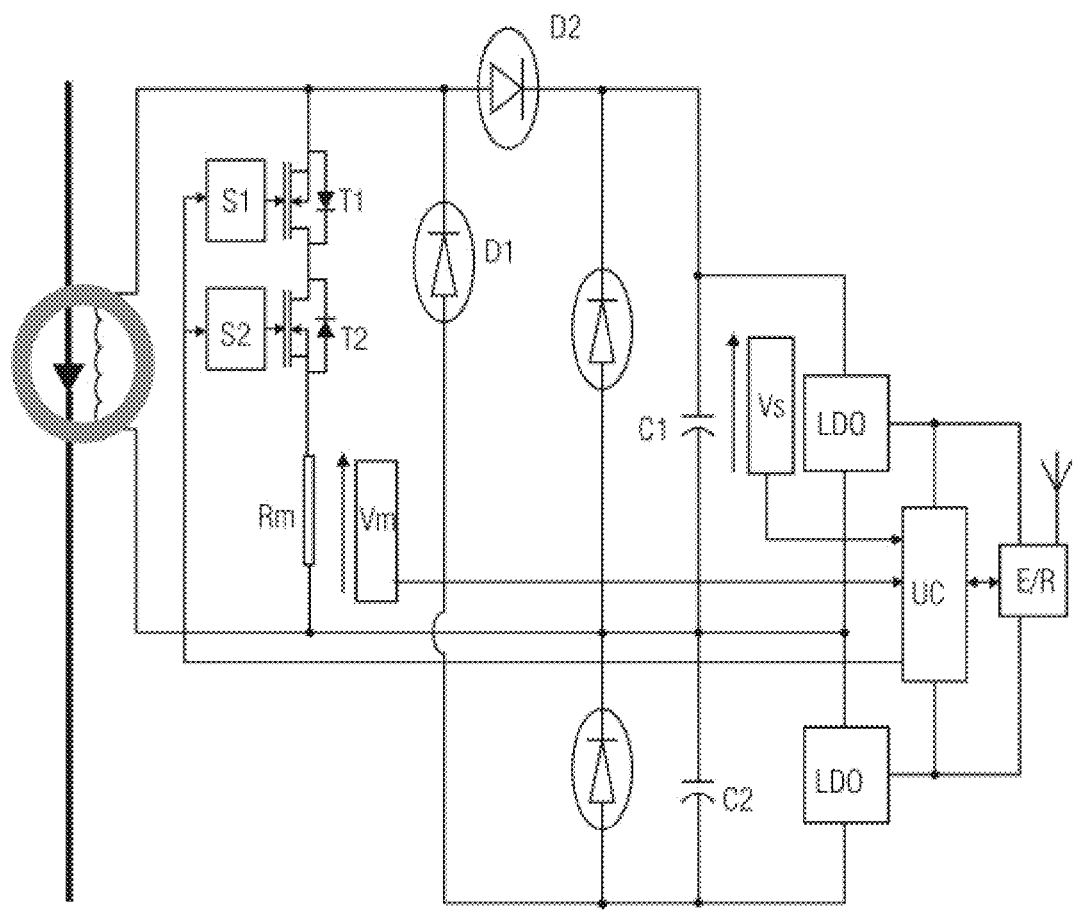
FIG. 1 is a schematic diagram of time division multiplexing of a mutual inductor in order to supply power to electronic components in a current sensor in the prior art.
Figure 2:
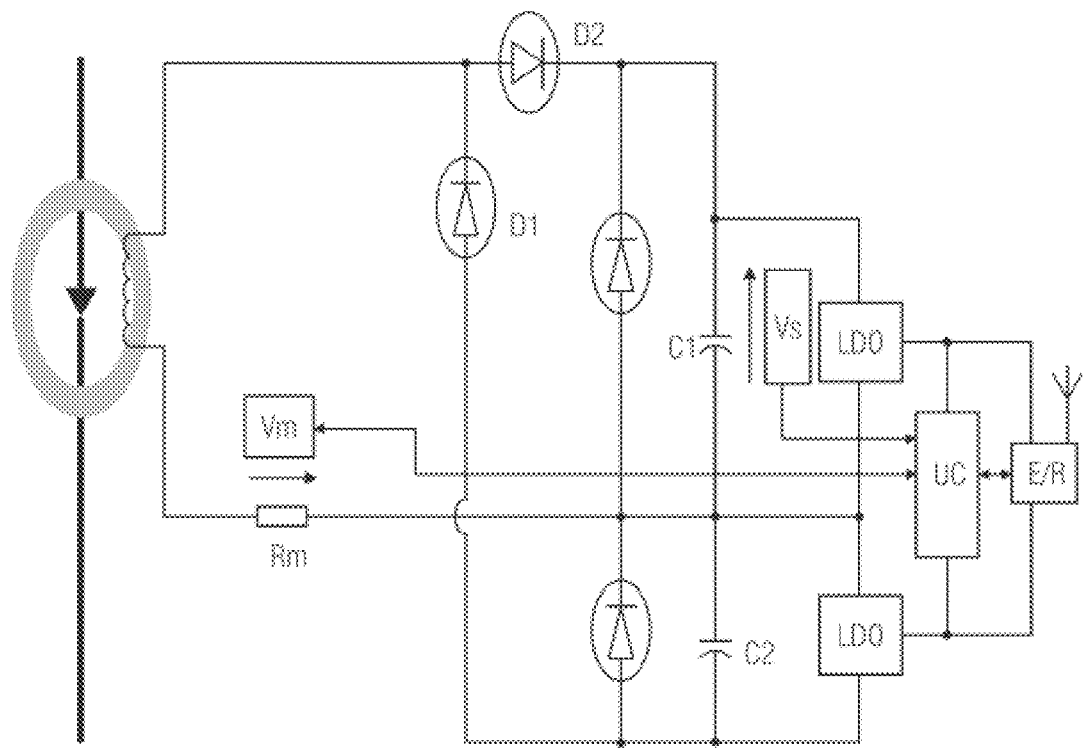
FIG. 2 is a schematic diagram of the continuous supply of power to electronic components in a current sensor in the prior art.

| Key to the drawings: | |
|---|---|
| 300 | current sensor unit |
| 301 | rectification module |
| 302 | power source conversion module |
| 303 | mode switching module |
| 304 | current sensor module |
| 305 | control module |
| 306 | signal conditioning module |
| 307 | output module |
| 308 | self-calibration module |
| 401 | primary-side circuit of current transformer |
| 402 | secondary-side circuit of current transformer |
| 403 | current loop during operation in charging mode |
| 404 | current loop during operation in energy release mode |
| 900-916 | steps |

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment is directed to a current sensor unit, comprising:
  a rectification module, configured to convert an AC current to a pulsed DC current;
  a power source conversion module containing an energy storage element, connected to the rectification module and configured to store energy for the energy storage element based upon the pulsed DC current during operation in a charging mode and to generate a power supply current based upon a voltage of the energy storage element;
  a mode switching module, connected to the rectification module and configured to be bypassed by the power source conversion module during operation in the charging mode, and to bypass the power source conversion module during operation in an energy release mode;
  a current sensor module, connected to the rectification module, the power source conversion module and the mode switching module separately and configured to detect a pulsed DC current flowing back from the power source conversion module or a pulsed DC current flowing back from the mode switching module;
  a control module, configured to acquire electrical energy from the power supply current, determine that operation is in the charging mode or the energy release mode based upon the voltage of the energy storage element, and acquire a first detection value that is provided by the current sensor module and relates to a pulsed DC current; and
  a self-calibration module, configured to generate a predetermined current flowing through the current sensor module in a self-calibration process;
  wherein the current sensor module is further configured to detect the predetermined current; and the control module is further configured to calibrate the first detection value based upon a second detection value that is provided by the current sensor module and relates to the predetermined current.

As can be seen, in an embodiment of the present invention, the current sensor unit can continuously detect current, and thereby effectively prevent a sudden current change event; moreover, the supply of power is not continuous, so sampling precision can be improved and high power consumption can be prevented. In addition, the current sensor unit further has a self-calibration function, thereby ensuring the measurement precision after long-term use in harsh conditions (e.g. high temperature and high humidity).

In one embodiment, also included is:
  a signal conditioning module, arranged between the current sensor module and the control module, and configured to acquire electrical energy from the power supply current and to condition the first detection value and the second detection value.

Thus, the signal conditioning module in an embodiment of the present invention can acquire electrical energy from the power supply current, and by subjecting the detection value to signal conditioning, can also amplify and strengthen the detection value, converting the detection value to a voltage signal that can be conditioned by the control module, making it easier for the control module to perform signal processing.

In one embodiment, the control module is configured to determine that operation is in the energy release mode when the voltage of the energy storage element is greater than or equal to a first predetermined value, and to determine that operation is in the charging mode when the voltage of the energy storage element is lower than or equal to a second predetermined value, wherein the first predetermined value is greater than the second predetermined value.

Thus, the control module in an embodiment of the present invention can control the specific operating mode based upon the size of the voltage of the energy storage element.

In one embodiment, the control module is configured to calculate a calibration factor based upon the second detection value and a theoretical value of the predetermined current, and to calibrate the first detection value based upon the calibration factor.

Thus, an embodiment of the present invention can conveniently calculate the calibration factor, and conveniently calibrate the first detection value using the calibration factor.

In one embodiment, the control module is further configured to abandon a calibration factor that is greater than a first predetermined threshold or less than a second predetermined threshold, wherein the first predetermined threshold is greater than the second predetermined threshold.

As can be seen, an embodiment of the present invention can also screen out inaccurate calibration factors.

In one embodiment, the self-calibration module comprises:
a first switch;
a diode, an anode of the diode being connected to the rectification module;
a capacitor, a first end of the capacitor being connected to a cathode of the diode;
a second switch, connected to a second end of the capacitor;
a voltage control current source, connected in parallel with the capacitor; and
a third switch, arranged between the voltage control current source and the current sensor module.

As can be seen, an embodiment of the present invention also proposes a self-calibration module that uses a capacitor to provide a voltage for a voltage control current source.

In one embodiment, the rectification module comprises a full-bridge rectification circuit or a half-bridge rectification circuit; and the rectification module further comprises:
a transient voltage suppression element, connected in parallel with the full-bridge rectification circuit or half-bridge rectification circuit.

As can be seen, the rectification module in an embodiment of the present invention has more than one form of circuit arrangement, and can also suppress transient voltages.

A current detection circuit, comprising:
a current transformer, containing a primary-side circuit and a secondary-side circuit;
a current sensor unit, connected to an output terminal of the secondary-side circuit, wherein the current sensor unit comprises: a rectification module, configured to convert an AC current outputted by the secondary-side circuit via the output terminal to a pulsed DC current; a power source conversion module containing an energy storage element, connected to the rectification module and configured to store energy for the energy storage element based upon the pulsed DC current during operation in a charging mode and to generate a power supply current based upon a voltage of the energy storage element; a mode switching module, connected to the rectification module and configured to be bypassed by the power source conversion module during operation in the charging mode, and to bypass the power source conversion module during operation in an energy release mode; a current sensor module, connected to the rectification module, the power source conversion module and the mode switching module separately and configured to detect a pulsed DC current flowing back from the power source conversion module or a pulsed DC current flowing back from the mode switching module; a control module, configured to acquire electrical energy from a power supply current, determine that operation is in the charging mode or the energy release mode based upon the voltage of the energy storage element, and acquire a first detection value that is provided by the current sensor module and relates to a pulsed DC current; a self-calibration module, configured to generate a predetermined current flowing through the current sensor module in a self-calibration process; wherein the current sensor module is further configured to detect the predetermined current; and the control module is further configured to calibrate the first detection value based upon a second detection value that is provided by the current sensor module and relates to the predetermined current.

Thus, an embodiment of the present invention also realizes a current detection circuit for a current transformer, which can continuously detect current, and thereby effectively prevent a sudden current change event; moreover, the supply of power is not continuous, so sampling precision can be improved and high power consumption can be prevented. In addition, the current sensor unit further has a self-calibration function, thereby ensuring the measurement precision after long-term use in harsh conditions (e.g. high temperature and high humidity).

In one embodiment, the self-calibration module comprises:
a first switch;
a diode, an anode of the diode being connected to the rectification module;
a capacitor, a first end of the capacitor being connected to a cathode of the diode;
a second switch, connected to a second end of the capacitor;
a voltage control current source, connected in parallel with the capacitor; and
a third switch, arranged between the voltage control current source and the current sensor module.

Thus, an embodiment of the present invention also proposes a self-calibration module that uses a capacitor to provide a voltage for a voltage control current source.

In one embodiment, the control module is configured to calculate a calibration factor based upon the second detection value and a theoretical value of the predetermined current, and to calibrate the first detection value based upon the calibration factor.

Thus, an embodiment of the present invention can conveniently calculate the calibration factor, and conveniently calibrate the first detection value using the calibration factor.

The present invention is explained in further detail below in conjunction with the accompanying drawings and embodiments, to clarify the technical solution and advantages thereof. It should be understood that the particular embodiments described here are merely intended to explain the present invention elaboratively, not to define the scope of protection thereof.

The solution of the present invention is expounded below by describing a number of representative embodiments, in order to make the description concise and intuitive. The large number of details in the embodiments are merely intended to assist with understanding of the solution of the present invention. However, obviously, the technical solution of the present invention need not be limited to these details when implemented. To avoid making the solution of the present invention confused unnecessarily, some embodiments are not described meticulously, but merely outlined. Hereinbelow, "comprises" means "including but not limited to", while "according to . . . " means "at least according to . . . , but not limited to only according to . . . ". In line with the linguistic customs of Chinese, in cases where the quantity of a component is not specified hereinbelow, this means that there may be one or more of the component; this may also be interpreted as meaning at least one.

In an embodiment of the present invention, a current sensor unit having a novel structure is proposed. The current sensor unit can continuously detect current, and thereby effectively prevent a sudden current change event; moreover, the supply of power is not continuous, so sampling precision can be improved and high power consumption can be prevented.

Figure 3:
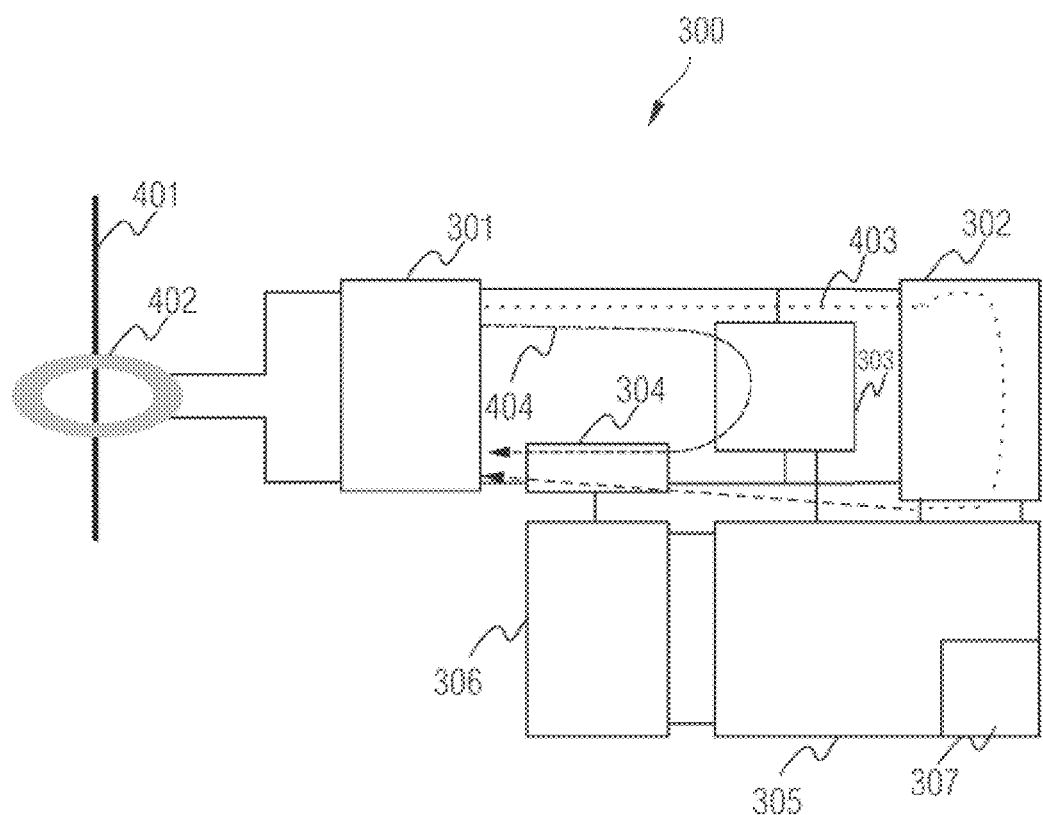
FIG. 3 is a demonstrative structural diagram of the current sensor unit of an embodiment of the present invention.

FIG. 3 is a demonstrative structural diagram of the current sensor unit of the present invention.

As shown in FIG. 3, the current sensor unit 300 comprises:
- a rectification module 301, configured to convert an AC current to a pulsed DC current;
- a power source conversion module 302 containing an energy storage element (not shown in FIG. 3, preferably containing a capacitor), connected to the rectification module 301 and configured to store energy for the energy storage element based upon the pulsed DC current when the current sensor unit 300 is operating in a charging mode and to generate a power supply current based upon a voltage of the energy storage element;
- a mode switching module 303, connected to the rectification module 301 and configured to be bypassed by the power source conversion module 302 when the current sensor unit 300 is operating in the charging mode, and to bypass the power source conversion module 302 when the current sensor unit 300 is operating in an energy release mode;
- a current sensor module 304, connected to the rectification module 301, the power source conversion module 302 and the mode switching module 303 separately and configured to detect a pulsed DC current flowing back from the power source conversion module 302 or a pulsed DC current flowing back from the mode switching module 303;
- a control module 305, configured to acquire electrical energy from the power supply current, acquire a detection value provided by the current sensor module 304 (i.e. a detection value for a pulsed DC current flowing through the current sensor module 304), and determine that the current sensor unit 300 operates in the charging mode or energy release mode based upon the voltage of the energy storage element.

Preferably, the following factors are taken into account:
(1) a detection value signal provided by the current sensor module 304 is itself relatively weak, and requires strengthening by amplification;
(2) a voltage range of the detection value signal provided by the current sensor module 304 generally does not meet a voltage input requirement of a subsequent module;
(3) noise in the detection value signal provided by the current sensor module 304 must be filtered out.

Thus, in an embodiment of the present invention, the detection value signal provided by the current sensor module 304 also undergoes signal conditioning.

In one embodiment, the current sensor unit 300 further comprises a signal conditioning module 306. The signal conditioning module 306 is arranged between the current sensor module 304 and the control module 305, and configured to acquire electrical energy from the power supply current and to condition the detection value provided by the current sensor module 304.

Preferably, the signal conditioning module 306 may contain various types of power amplifier structure, to subject the detection value signal provided by the current sensor module 304 to power amplification. The signal conditioning module 306 may further contain a noise filtering element; the embodiments of the present invention do not impose any restrictions in this regard.

The current sensor unit in FIG. 3 is connected to a current transformer. The current transformer contains a primary-side circuit 401 and a secondary-side circuit 402. Based on the principle of electromagnetic induction, the current transformer converts a large current in the primary-side circuit 401 to a small current in the secondary-side circuit 402, in order to be measured by the current sensor unit 300. The current transformer may consist of a closed core and a winding. In general, the primary-side circuit 401 has a very small number of winding turns, and is series-connected in a current line requiring measurement, therefore it often has the entire current of the line flowing through it; the secondary-side circuit 402 has a relatively large number of winding turns, and is series-connected with the current sensor unit.

In FIG. 3, the rectification module 301 is connected to an output terminal of the secondary-side circuit 402 of the current transformer. The rectification module 301 converts an AC current outputted via the output terminal by the secondary-side circuit 402 to a pulsed DC current.

In one embodiment, the rectification module 301 comprises a full-bridge rectification circuit or a half-bridge rectification circuit; and the rectification module 301 further comprises a transient voltage suppression element (not shown in FIG. 3). The transient voltage suppression element is connected in parallel with the full-bridge rectification circuit or half-bridge rectification circuit. Preferably, the transient voltage suppression element may be implemented as a transient voltage suppressor (TVS) or a varistor, etc.

In one embodiment, the power source conversion module 302 may contain a switching power source or a linear power source. Preferably, an anti-reverse diode is configured at a frontmost end of the power source conversion module 302, to prevent energy of a rear-end power source from being released in a reverse direction when the mode switching module 303 is bypassed. At the same time, since the anti-return diode has a conduction switch-on voltage, a front-end current will also be blocked by the anti-return diode and will not flow into the power source conversion module 302, so as to ensure the effectiveness of the bypass function. Furthermore, the energy storage element contained in the power source conversion module 302 may be used to provide energy required by a load when charging is not taking place.

The energy storage element in the power source conversion module 302 may be implemented as a capacitor. Moreover, the power source conversion module 302 may further comprise: an anti-return diode; a Buck circuit, connected to the anti-return diode, and capable of outputting a continuous power supply current based upon electrical energy stored in the energy storage element; a first resistor, connected to the Buck circuit and the anti-return diode separately; a second resistor, connected to the first resistor; wherein a connection point of the first resistor and second resistor is connected to a signal detection end of the control module 305.

The specific circulation path of the pulsed DC current outputted by the rectification module 301 may be controlled by the mode switching module 303.

Specifically:

(1) When the mode switching module 303 is bypassed by the power source conversion module 302 (this corresponds to the current sensor unit 300 operating in the charging mode), the pulsed DC current will not flow through the mode switching module 303, but will flow in its entirety from the rectification module 301 to the power source conversion module 302. The voltage of the energy storage element contained in the power source conversion module 302 will rise, and the electrical energy provided by the pulsed DC current is stored.

Moreover, the power source conversion module 302 also generates a power supply current based upon the voltage of the energy storage element. This power supply current is provided to electronic components that need to be provided with electrical energy in the current sensor unit 300, for example provided to the control module 305 and the signal conditioning module 306, so as to provide electrical energy to the control module 305 and the signal conditioning module 306. The power source conversion module 302 is also connected to the current sensor module 304. The pulsed DC current flows to the current sensor module 304 from the power source conversion module 302. The current sensor module 304 can detect the pulsed DC current. The pulsed DC current then flows back to the current transformer from the current sensor module 304.

As shown by the current loop 403 during operation in the charging mode in FIG. 3, in the charging mode, the loop of the pulsed DC current comprises: secondary-side circuit 402 of current transformer→rectification module 301→power source conversion module 302→current sensor module 304→secondary-side circuit 402 of current transformer.

During charging in the charging mode, the current flowing through the current sensor module 304 can reflect a primary-side current of the current transformer. Although this kind of reflection relationship might not be completely correct due to current fluctuation during charging, it can serve as a basis for determining a sudden change in the primary-side current. Thus, the charging mode can be regarded as a non-precise sampling process for the primary-side current of the current transformer.

(2) When the mode switching module 303 bypasses the power source conversion module 302 (this corresponds to the current sensor unit 300 operating in the energy release mode), the pulsed DC current will not flow through the power source conversion module 302, but will flow in its entirety from the rectification module 301 to the mode switching module 303. The mode switching module 303 is also connected to the current sensor module 304. The pulsed DC current also flows from the mode switching module 303 to the current sensor module 304. The current sensor module 304 can detect the pulsed DC current. The pulsed DC current then flows back to the current transformer from the current sensor module 304.

In the energy release mode, the power source conversion module 302 still generates a power supply current based upon the voltage of the energy storage element contained in the power source conversion module 302 (the current sensor unit 300 was previously operating in the charging mode). This power supply current is provided to electronic components that need to be provided with electrical energy in the current sensor unit 300, for example provided to the control module 305 and the signal conditioning module 306, so as to provide electrical energy to the control module 305 and the signal conditioning module 306.

In the energy release mode, all of the current outputted by the current transformer flows through the mode switching module 303, and is transmitted back to the current transformer via the current sensor module 304. Thus, a current transformer primary-side current value detected via the current sensor module 304 is accurate. Moreover, an input-end voltage of the power source conversion module 302 no longer rises, i.e. surplus energy exceeding a predetermined voltage is released, thereby ensuring that a rear-end device will not be damaged due to overvoltage; at the same time, a release loop through the rectification module 301 containing the transient voltage suppression element, the mode switching module 303 and the current sensor module 304 causes the secondary-side voltage of the current transformer to be lower. The same current is released, and the lower released voltage ensures that a release power consumption of the secondary side of the current transformer is lower.

As shown by the current loop 404 during operation in the energy release mode in FIG. 3, in the energy release mode, the loop through which the pulsed DC current flows comprises: secondary-side circuit 402 of current transformer→rectification module 301→mode switching module 303→current sensor module 304→secondary-side circuit 402 of current transformer.

As can be seen, since the current sensor module 304 is arranged on a common path of the loop of the pulsed DC current in the charging mode and the loop of the pulsed DC current in the energy release mode, the current sensor module 304 can detect a current outputted by the current transformer regardless of whether the current sensor unit 300 is in the energy release mode or the charging mode, thus the detection of current is continuous, and can be used as a basis for determining a sudden change in the primary-side current.

In one embodiment, the control module 305 is configured to determine that the current sensor unit 300 operates in the energy release mode when the voltage of the energy storage element in the power source conversion module 302 is greater than or equal to a first predetermined value, at which time the mode switching module 303 bypasses the power source conversion module 302; and to determine that the current sensor unit 300 operates in the charging mode when the voltage of the energy storage element in the power source conversion module 302 is lower than or equal to a second predetermined value, at which time the mode switching module 303 is bypassed by the power source conversion module 302, wherein the first predetermined value is greater than the second predetermined value.

Preferably, the mode switching module 303 may be implemented as a metal-oxide semiconductor field effect transistor (MOS) or a bipolar junction transistor; the current sensor module 304 may be implemented as a resistor configured to convert a current signal to a voltage signal, or as another type of current sensor, e.g. a Hall element, etc.

In one embodiment, the control module 305 is further configured to calculate an output value based upon the detection value; the current sensor unit 300 further comprises: an output module 307, configured to output the output value by wired communication or wireless communication. The output module 307 may be implemented as a separate element connected to the control module 305, or be integrated with the control module 305.

For example, when the AC current received by the rectification module 301 is the secondary-side current of the current transformer, the control module 305 calculates a primary-side current value according to a predetermined conversion relation (e.g. a number-of-turns ratio between the primary side and secondary side of the current transformer), and uses this primary-side current value as the output value. The output module 307 receives the output value from the control module 305, and sends the output value to a receiving side via a wired interface or wireless interface. For example, the wired interface comprises at least one of the following: a universal serial bus interface, controller local area network interface or serial port, etc.; the wireless interface comprises at least one of the following: an infrared interface, near field communication interface, Bluetooth interface, Zigbee interface, wireless broadband interface, etc.

The control module 305 may be implemented as comprising one or more central processors or one or more field-programmable gate arrays, wherein the field-programmable gate array integrates one or more central processor cores. Specifically, the central processor or central processor core may be implemented as a CPU, MCU or digital signal processor (DSP), etc. Preferably, the control module 305 may further comprise a human-machine interface (HMI), and a user instruction relating to output value transmission, etc. can be received via the HMI.

As can be seen, in the circuit architecture of embodiments of the present invention, only one current transformer need be used. The rectification module 301 converts the AC outputted by the current transformer to a pulsed DC current, and the circulation path of the pulsed DC current is controlled by the mode switching module 303.

When the current sensor unit 300 is in the charging mode, the flow direction of the pulsed DC current is as indicated by the current loop 403. At this time, the whole of the pulsed DC current is inputted to the power source conversion module 302, and the power source conversion module 302 can provide electrical energy for the subsequent signal conditioning module 306, control module 305 and output module 307, etc. based upon the pulsed DC current. Specifically, the voltage of the energy storage element contained in the power source conversion module 302 is raised by the pulsed DC current, and the energy storage element stores the electrical energy provided by the pulsed DC current.

Moreover, the power source conversion module 302 also generates a power supply current based upon the voltage of the energy storage element. This power supply current is provided to electronic components that need to be provided with electrical energy in the current sensor unit 300, for example provided to the control module 305, signal conditioning module 306 and output module 307. Furthermore, the pulsed DC current inputted to the power source conversion module 302 flows back to the current transformer through the current sensor module 304, wherein the current sensor module 304 detects the pulsed DC current flowing through itself.

When the current sensor unit 300 is in the energy release mode, the flow direction of the pulsed DC current is as indicated by the current loop 404. At this time, the whole of the pulsed DC current is inputted to the mode switching module 303. Furthermore, the pulsed DC inputted to the mode switching module 303 flows back to the current transformer through the current sensor module 304, wherein the current sensor module 304 detects the pulsed DC current flowing through itself. In the energy release mode, the power source conversion module 302 continues to generate a power supply current based upon the voltage of the energy storage element (the current sensor unit 300 was previously operating in the charging mode and has stored energy). This power supply current is provided to electronic components that need to be provided with electrical energy in the current sensor unit 300, for example provided to the control module 305, signal conditioning module 306 and output module 307, etc.

In FIG. 3, the current sensor module 304 is arranged on a common path during operation of the mode switching module 303 and power source conversion module 302. Thus, the current sensor module 304 can detect a current outputted by the current transformer regardless of whether the current sensor unit 300 is in the energy release mode or the charging mode, thus the detection of current is continuous, and can be used as a basis for determining a sudden change in the primary-side current.

In FIG. 3, the signal conditioning module 306 can convert the detection value (generally a voltage signal) outputted by the current sensor module 304 to a voltage signal that can be processed by the control module 305. The conditioning process may be linear, and is not affected much by temperature, and in particular may be implemented by an operational amplifier. The control module 305 can calculate a corresponding current value, i.e. the primary-side current value of the current transformer, based upon the voltage signal provided by the signal conditioning module 306. Furthermore, the control module 305 also determines whether operation is in the charging mode or energy release mode based upon the voltage value of the energy storage element contained in the power source conversion module 302. In addition, in FIG. 3, the input-end voltage of the power source conversion module 302 no longer rises when the mode switching module 303 begins the bypassing operation, thereby ensuring that the rear end meanwhile will not experience overvoltage and be damaged.

In an embodiment of the present invention, for a current range requiring precise sampling, the signal conditioning module 306 can use a multi-stage amplification circuit with a gradually increasing amplification factor, wherein different amplification stages are responsible for different current ranges.

The current sensor unit shown in FIG. 3 may be implemented by way of various forms of specific circuit. For example, FIG. 4 is a first demonstrative circuit diagram of the current sensor unit of the present invention.

Figure 4:
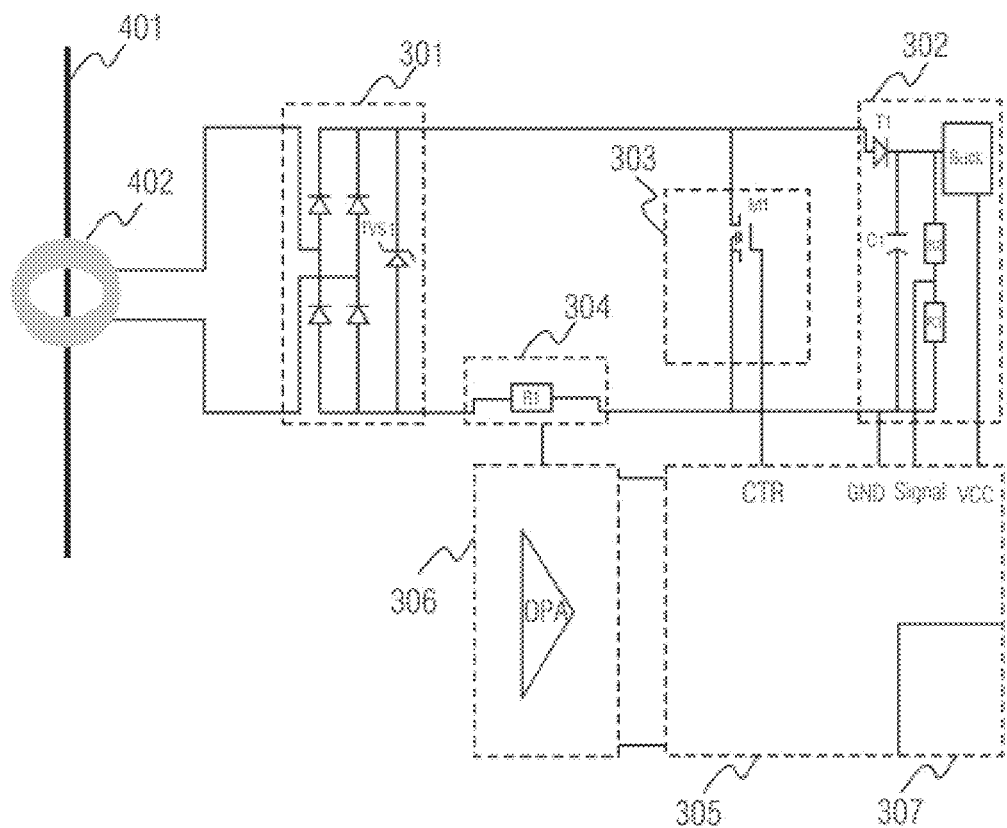
FIG. 4 is a first demonstrative circuit diagram of the current sensor unit of an embodiment of the present invention.

In FIG. 4, the mode switching module 303 is arranged at a rear end of the rectification module 301. The rectification module 301 comprises a full-bridge rectification circuit and a transient voltage suppressor TVS1. The mode switching module 303 comprises a MOS transistor M1; the power source conversion module 302 comprises: an anti-return diode T1; a Buck circuit connected to the anti-return diode T1; a resistor R2, connected separately to the Buck circuit and the anti-return diode T1; and a resistor R3 connected to the resistor R2; a connection point of the resistor R2 and resistor R3 is connected to a signal detection end "Signal" of the control module 305; the Buck circuit is connected to a power source end VCC of the control module 305; and a capacitor C1 is connected to the anti-return diode T1.

The control module 305 detects a voltage of the capacitor C1 based upon the signal detection end "Signal", determines that operation is in the energy release mode when the voltage of the capacitor C1 is greater than or equal to the first predetermined value, and determines that operation is in the charging mode when the voltage of the capacitor C1 is less than or equal to the second predetermined value, wherein the first predetermined value is greater than the second predetermined value.

When operation is in the charging mode, the control module 305 sends a turn-off signal to the mode switching module 303 via a control end CTR, and the MOS transistor M1 is turned off based upon the turn-off signal, such that the mode switching module 303 is bypassed by the power source conversion module 302. When operation is in the energy release mode, the control module 305 sends a turn-on signal to the mode switching module 303 via the control end CTR, and the MOS transistor M1 is turned on, based upon the turn-on signal, such that the power source conversion module 302 is bypassed by the mode switching module 303.

In the charging mode, the pulsed DC current outputted by the rectification module 301 is inputted to the power source conversion module 302. The pulsed DC current is filtered by the capacitor C1, and the capacitor at the same time also has an energy storage function. The Buck circuit then converts the energy stored in the capacitor C1 to a DC voltage for supplying power to the rear end. The DC voltage is outputted to the power source end VCC of the control module 305 and to the signal conditioning module 306, so as to supply power stably to the control module 305 and signal conditioning module 306. Furthermore, the pulsed DC current also flows back to the secondary side of the mutual inductor via the current sensor module 304.

In the energy release mode, the pulsed DC current outputted by the rectification module 301 is inputted to the mode switching module 303. The pulsed DC current flows back to the secondary side of the mutual inductor via the current sensor module 304. At this time, the Buck circuit still converts the energy stored in the capacitor C1 to a DC voltage for supplying power to the rear end. The DC voltage is outputted to the power source end VCC of the control module 305 and to the signal conditioning module 306, so as to supply power stably to the control module 305 and signal conditioning module 306.

In one embodiment, the signal conditioning module 306 in FIG. 3 comprises: a first-stage operational amplifier unit, comprising an operational amplifier connected to the current sensor module 304; a second-stage operational amplifier unit, connected to an output end of the operational amplifier; wherein the second-stage operational amplifier comprises multiple operational amplifiers connected in parallel with each other, or the second-stage operational amplifier comprises multiple operational amplifiers connected in series with each other. For a current range requiring precise sampling, a multi-stage op-amp circuit with a gradually increasing amplification factor can be used, to increase the resolution of current detection. For a current range needing to have event triggering, an op-amp circuit with a small amplification factor and a short delay can be used.

Figure 5:
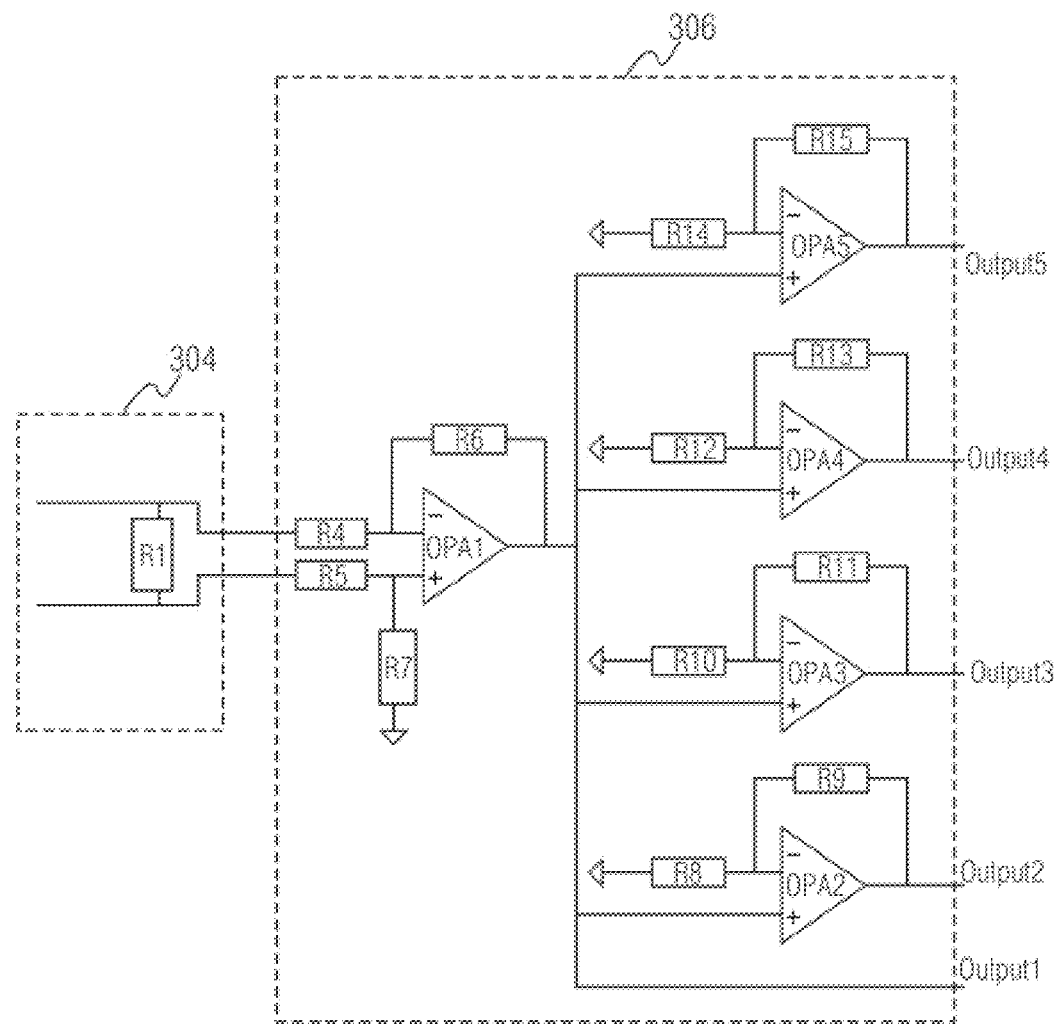
FIG. 5 is a first demonstrative circuit diagram of the signal conditioning module of an embodiment of the present invention.

FIG. 5 is a first demonstrative circuit diagram of the signal conditioning module of the present invention.

In FIG. 5, the signal conditioning module 306 comprises: a first-stage operational amplifier unit, comprising an operational amplifier OPA1 connected to the current sensor module 304; a second-stage operational amplifier unit, connected to an output end of the operational amplifier OPA1; wherein the second-stage operational amplifier comprises 4 operational amplifiers connected in parallel with each other, specifically an operational amplifier OPA2, an operational amplifier OPA3, an operational amplifier OPA4 and an operational amplifier OPA5. The amplification factors and delays of the operational amplifiers may be the same or different. Thus, correspondingly, the signal conditioning module 306 may have 5 outputs, specifically Output1, Output2, Output3, Output4 and Output5.

Figure 6:
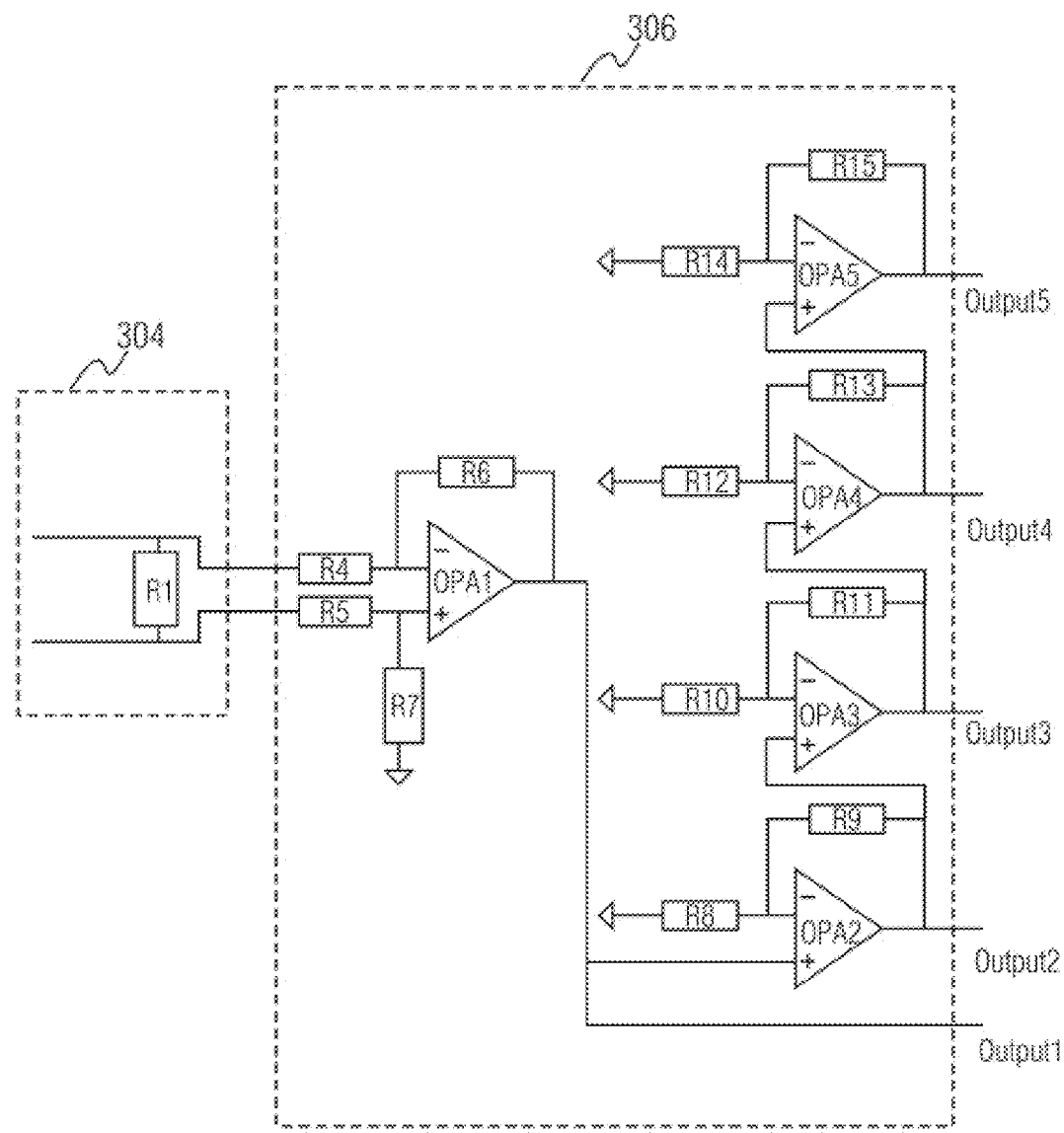
FIG. 6 is a second demonstrative circuit diagram of the signal conditioning module of an embodiment of the present invention.

FIG. 6 is a second demonstrative circuit diagram of the signal conditioning module of the present invention.

In FIG. 6, the signal conditioning module 306 comprises: a first-stage operational amplifier unit, comprising an operational amplifier OPA1 connected to the current sensor module 304; a second-stage operational amplifier unit, connected to an output end of the operational amplifier OPA1; wherein the second-stage operational amplifier comprises 4 operational amplifiers connected in series with each other, specifically an operational amplifier OPA2, an operational amplifier OPA3, an operational amplifier OPA4 and an operational amplifier OPA5. The amplification factors and delays of the operational amplifiers may be the same or different. Thus, correspondingly, the signal conditioning module 306 has 5 outputs, specifically Output1, Output2, Output3, Output4 and Output5.

Typical examples of the signal conditioning module have been described demonstratively above. Those skilled in the art will realize that such a description is purely demonstrative, and not intended to define the scope of protection of embodiments of the present invention.

Those skilled in the art will realize that the circuit shown in FIG. 3 could be subjected to various changes, deletions or omissions. All such changes, deletions or omissions should be included in the scope of protection of embodiments of the present invention.

For example, in FIG. 3, the mode switching module 303 is arranged at the rear end of the rectification module 301. In fact, the mode switching module 303 could also be arranged at a front end of the rectification module 301.

Figure 7:
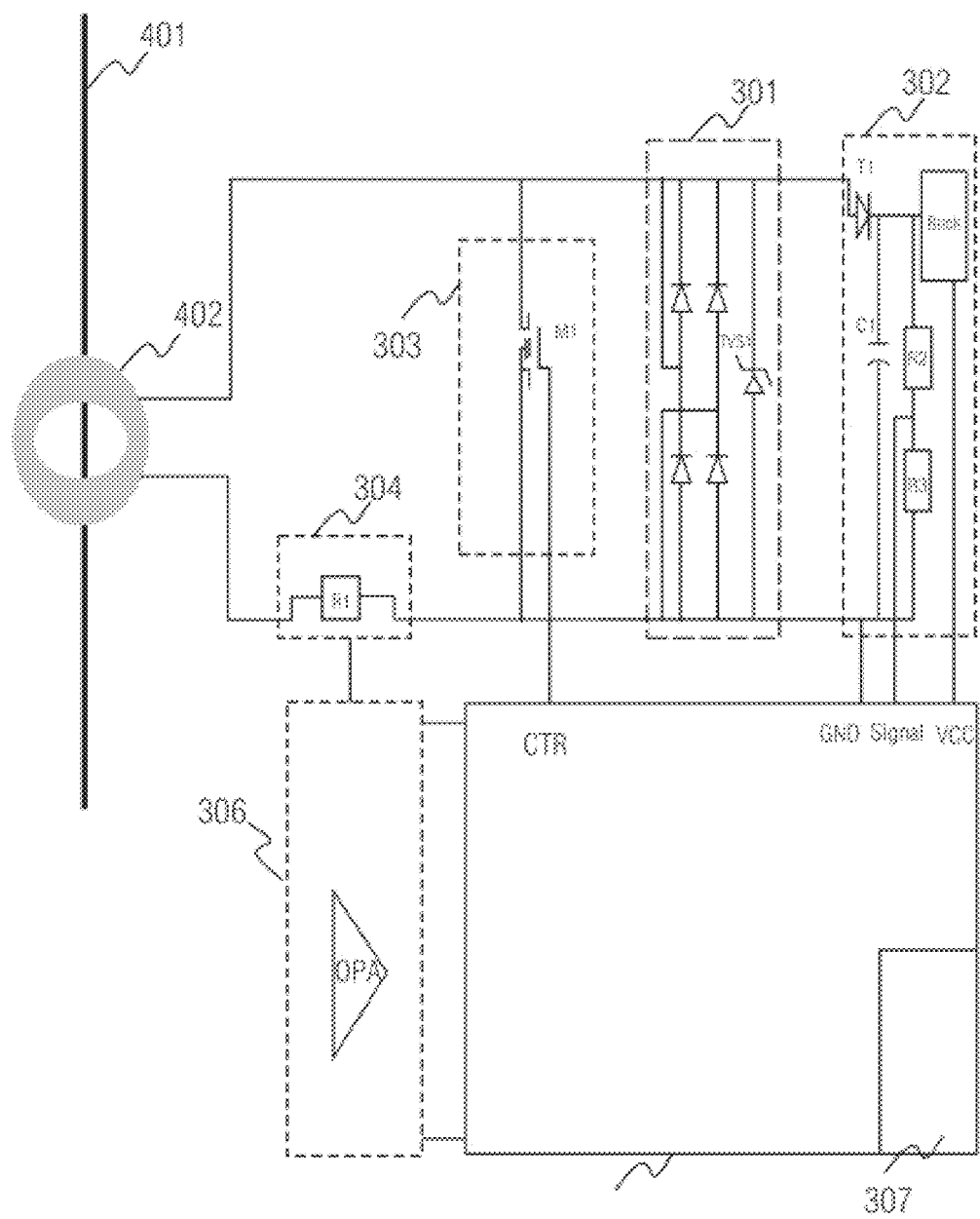
FIG. 7 is a second demonstrative circuit diagram of the current sensor unit of an embodiment of the present invention.

FIG. 7 is a second demonstrative circuit diagram of the current sensor unit of the present invention. As shown in FIG. 7, the mode switching module 303 is arranged at the front end of the rectification module 301.

The applicant has also made the following discovery: for the current sensor unit connected to a single current transformer as shown in FIG. 3, the secondary-side output of the current transformer is a current signal; the current signal outputted at the secondary side of the current transformer is converted to a voltage signal using the current sensor module 304 that is generally implemented as a resistor or Hall sensor, and the voltage signal passes through the signal conditioning module 306 containing an operational amplifier before being outputted to the control module 305. For application environments with high measurement precision requirements, neither temperature drift nor lifespan attenuation of the resistor or Hall sensor can be ignored. Although a low-temperature-drift device can generally be chosen to solve the problem of temperature drift, the problem of lifespan attenuation is difficult to solve. Thus, the question of how to guarantee the precision of the current sensor module 304 after long-term use in harsh conditions (e.g. high temperature and high humidity) is a challenge.

To solve this technical problem, an embodiment of the present invention further proposes a current sensor unit with a self-calibration function.

Figure 8:
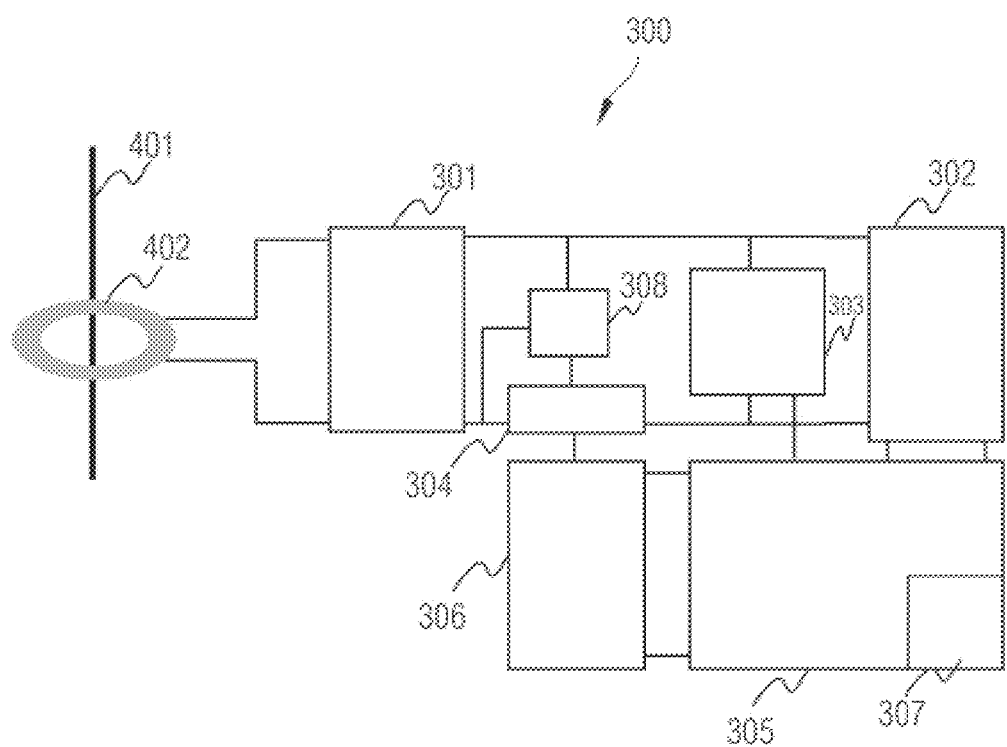
FIG. 8 is a demonstrative structural diagram of the current sensor unit with a self-calibration function according to an embodiment of the present invention.

FIG. 8 is a demonstrative structural diagram of the current sensor unit with a self-calibration function according to the present invention. Compared with the current sensor unit shown in FIG. 3, the current sensor unit in FIG. 8 further contains a self-calibration module 308, and further has a self-calibration function.

Specifically, as shown in FIG. 8, the current sensor unit 300 comprises:
- a rectification module 301, configured to convert an AC current to a pulsed DC current;
- a power source conversion module 302 containing an energy storage element (not shown in FIG. 8, preferably containing a capacitor), connected to the rectification module 301 and configured to store energy for the energy storage element based upon the pulsed DC current when the current sensor unit 300 is operating in a charging mode and to generate a power supply current based upon a voltage of the energy storage element;
- a mode switching module 303, connected to the rectification module 301 and configured to be bypassed by the power source conversion module 302 when the current sensor unit 300 is operating in the charging mode, and to bypass the power source conversion module 302 when the current sensor unit 300 is operating in an energy release mode;
- a current sensor module 304, connected to the rectification module 301, the power source conversion module 302 and the mode switching module 303 separately and configured to detect a pulsed DC current flowing back from the power source conversion module 302 or a pulsed DC current flowing back from the mode switching module 303;
- a control module 305, configured to acquire electrical energy from the power supply current, acquire a first detection value that is provided by the current sensor module 304 and relates to a pulsed DC current (i.e. a detection value for a pulsed DC current flowing through the current sensor module 304), and determine that the current sensor unit 300 operates in the charging mode or energy release mode based upon the voltage of the energy storage element;
- a self-calibration module 308, configured to generate a predetermined current flowing through the current sensor module 304 in a self-calibration process;
- wherein the current sensor module 304 is further configured to detect the predetermined current; and the control module 305 is further configured to calibrate the first detection value based upon a second detection value that is provided by the current sensor module 304 and relates to the predetermined current.

Compared with the various modules in the current sensor unit shown in FIG. 3, the corresponding modules in the current sensor unit in FIG. 8 have similar functions, which are not described again in embodiments of the present invention. Compared with the current sensor unit shown in FIG. 3, the current sensor unit in FIG. 8 further has the following characteristic: when the control module 305 in the current sensor unit in FIG. 8 discovers that a predetermined self-calibration condition is met (e.g. a continuous operating time of the current sensor unit 300 reaches a predetermined time threshold), the current sensor unit 300 enters the self-calibration process. Otherwise, when the control module 305 of the current sensor unit in FIG. 8 discovers that the predetermined self-calibration condition is not met, the current sensor unit 300 is in a non-self-calibration process. Here:

(1) When the current sensor unit is in the non-self-calibration process (including the charging mode and the energy release mode), the pulsed DC current outputted by the rectification module 301 does not flow through the self-calibration module 308, at which time the self-calibration module 308 corresponds to an open-circuit state. For the specific processing procedures of the charging mode and energy release mode, please refer to FIG. 3 and the corresponding detailed description above.

(2) When the current sensor unit 300 is in the self-calibration process, the pulsed DC current outputted by the rectification module 301 flows directly back to the current transformer via the self-calibration module 308. Moreover, the self-calibration module 308 generates a predetermined current flowing through the current sensor module 304. The current sensor module 304 detects the predetermined current; the control module 305 calibrates the first detection value generated in the charging mode and energy release mode, based upon the second detection value that is provided by the current sensor module 304 and relates to the predetermined current.

Due to the presence of the energy storage element in the power source conversion module 302, the control module 305 and signal conditioning module 306 can also be in an operating state continuously in the self-calibration process. The signal conditioning module 306 acquires electrical energy from the power supply current, and conditions the first detection value and second detection value. Based on the second detection value and a theoretical value of the predetermined current, the control module 305 calculates a calibration factor, and calibrates the first detection value based upon the calibration factor. Preferably, the control module 305 also abandons a calibration factor that is greater than a first predetermined threshold or less than a second predetermined threshold, wherein the first predetermined threshold is greater than the second predetermined threshold.

Figure 9:
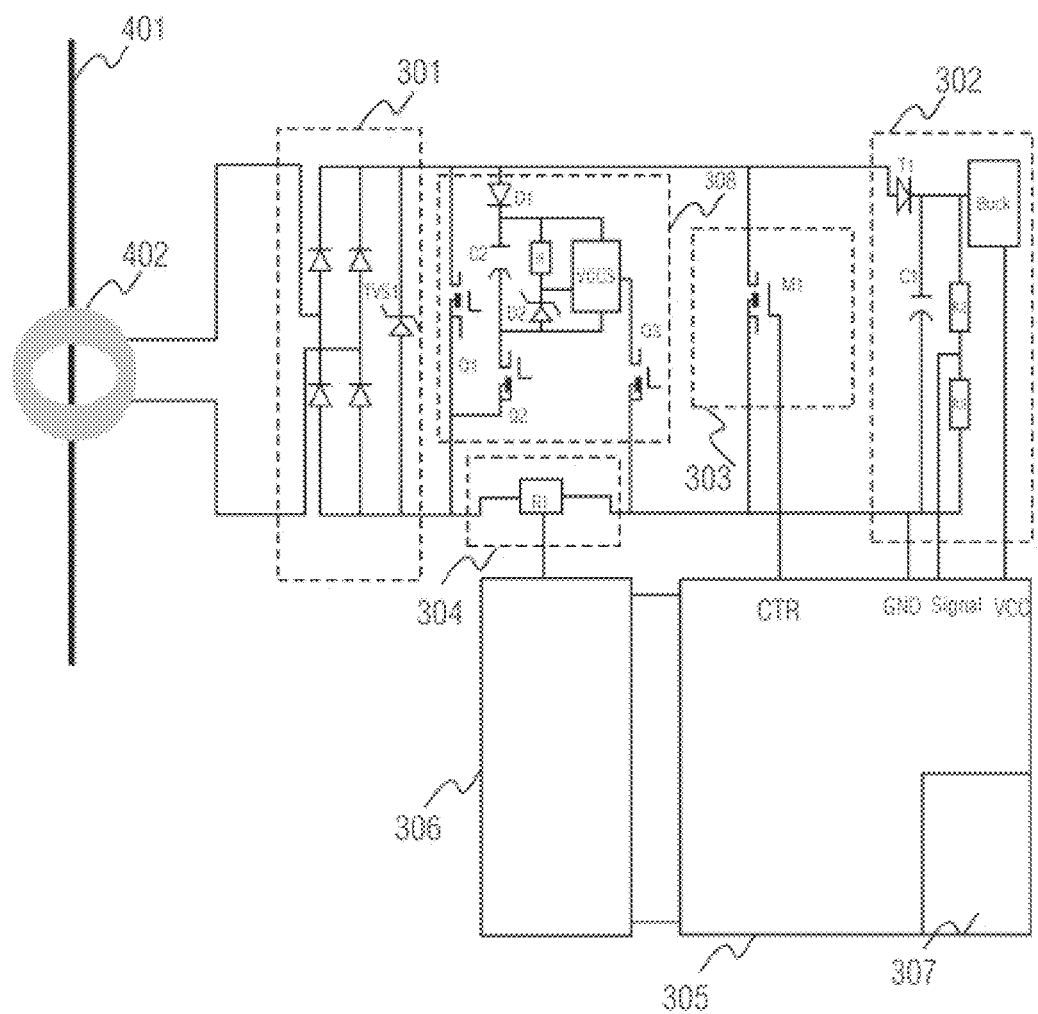
FIG. 9 is a demonstrative circuit diagram of the current sensor unit with a self-calibration function according to an embodiment of the present invention.
Figure 10:
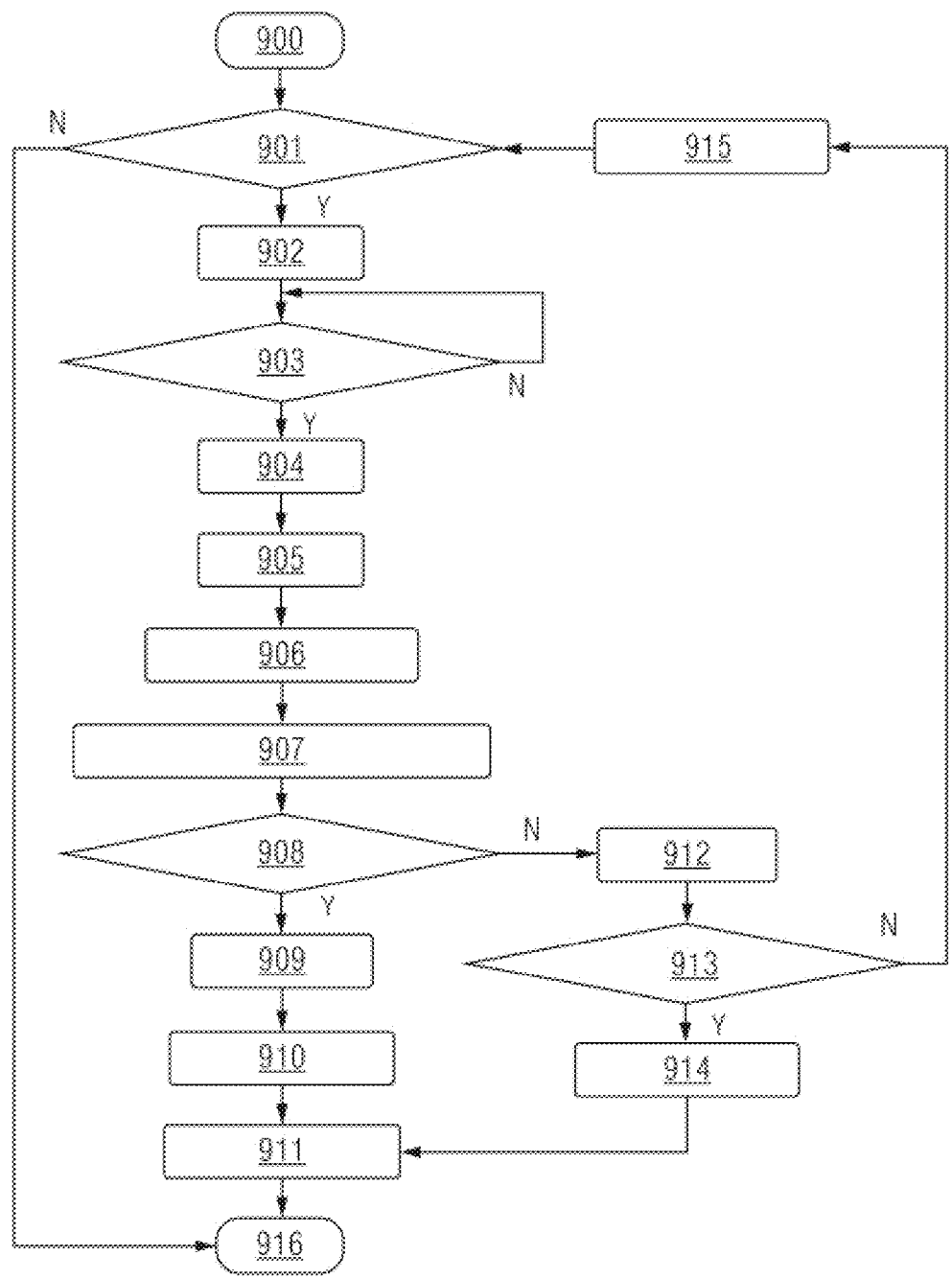
FIG. 10 is a demonstrative flow chart of the self-calibration process of the current sensor unit in FIG. 9.

FIG. 9 is a demonstrative circuit diagram of the current sensor unit with a self-calibration function according to the present invention. FIG. 10 is a demonstrative flow chart of the self-calibration process of the current sensor unit in FIG. 9.

As can be seen in FIG. 9, the self-calibration module 308 comprises: a first switch Q1; a diode D1, wherein an anode of the diode D1 is connected to the rectification module 301; a capacitor C2, wherein a first end of the capacitor C2 is connected to a cathode of the diode D1; a second switch Q2, connected to a second end of the capacitor C2; a voltage control current source VCCS, connected in parallel with the capacitor C2; and a third switch Q3, arranged between the voltage control current source VCCS and the current sensor module 304.

When the control module 306 determines that the preset self-calibration condition has not been met, the current sensor unit is in a non-self-calibration process. In the non-self-calibration process, the control module 306 controls the first switch Q1, second switch Q2 and third switch Q3 so as to all be OFF. At this time, the self-calibration module 308 corresponds to an open-circuit state, and will not affect normal operation of the energy release mode or charging mode.

Furthermore, when the control module 306 determines that the preset self-calibration condition has been met, the current sensor unit enters the self-calibration process. First of all, the control module 306 controls the second switch Q2 so as to be ON, thus the capacitor C2 begins charging, and due to the reverse-blocking action of the diode D1, the energy of the capacitor C2 will not be released to the outside of the self-calibration module 308. Since the voltages of the capacitor C2 and the energy storage element C1 in the power source conversion module 302 are approximately equal, the control module 305 detects the voltage of the energy storage element C1 in the power source conversion module 302 via a Signal port, and the control module 305 can indirectly ascertain the voltage of the capacitor C2.

When the voltage of the capacitor C2 rises to a predetermined value $V_{calibration}$, the control module 305 controls the first switch Q1 so as to be ON in order to cut off the effect of the primary-side current of the current transformer on the self-calibration module 308, at which time the pulsed DC current outputted by the rectification module 301 flows directly back to the current transformer via the self-calibration module 308. Immediately after, the rectification module 301 controls the third switch Q3 so as to be ON, leading an output current of the voltage control current source VCCS (i.e. a self-calibration current) into the current sensor module 304.

At the same time, due to the presence of the energy storage element C1 in the power source conversion module 302, the control module 305 and signal conditioning module 306 can also be in an operating state continuously in the self-calibration process; thus, the control module 306 can obtain the voltage signal that results when the output current flows through the current sensor module 304, can obtain a current value $I_{now}$ thereof by calculation, and by comparing $I_{now}$ with an ideal current value $I_{factory}$ corresponding to the output current, can obtain a calibration factor K, wherein $K=(I_{now}/I_{factory})$, and can then use the calibration factor K to calibrate a detection value obtained in the non-self-calibration process (e.g. taking the product of the calibration factor K and the detection value obtained in the non-self-calibration process to be a final detection value), thereby reducing the measurement error. Any calibration factor that exceeds a predetermined range is not used. Moreover, to avoid accidental events, multiple determinations are performed for calibration errors.

FIG. 10 is a demonstrative flow chart of the self-calibration process of the current sensor unit in FIG. 9.

As shown in FIG. 10, the self-calibration process comprises:

Step 900: start.
Step 901: determine whether preset self-calibration condition is met. If so, perform step 902 and subsequent steps; otherwise perform step 916 to end the procedure.
Step 902: control module turns second switch Q2 ON.
Step 903: determine whether voltage of capacitor C2 is greater than predetermined value $V_{calibration}$; if so, perform step 904 and subsequent steps, otherwise return and perform step 903 again.
Step 904: control module turns first switch Q1 ON.
Step 905: control module turns third switch Q3 ON, voltage control current source VCCS outputs current into current sensor module.
Step 906: acquire detection value $I_{now}$ relating to voltage signal of current sensor module.
Step 907: calculate calibration factor K, wherein $K=(I_{now}/I_{factory})$; $I_{factory}$ is ideal current value of output current.
Step 908: determine whether calibration factor K is within predetermined range; if so, perform step 910 and subsequent steps, otherwise perform step 913 and subsequent steps.
Step 909: set "falure" sign for number of failures to zero.
Step 910: determine that calibration is successful.
Step 911: turn first switch Q1, second switch Q2 and third switch Q3 OFF, and perform step 916 to end the procedure.
Step 912: set calibration factor K to 1, and add 1 to "falure" sign for number of failures.
Step 913: determine whether "falure" sign for number of failures is greater than predetermined value N; if so, perform step 914 and subsequent steps, otherwise perform step 915 and subsequent steps.
Step 914: determine that calibration has failed, and perform step 911 and subsequent step.
Step 915: turn first switch Q1, second switch Q2 and third switch Q3 OFF, and return to perform step 901.
Step 916: end.

Figure 11:
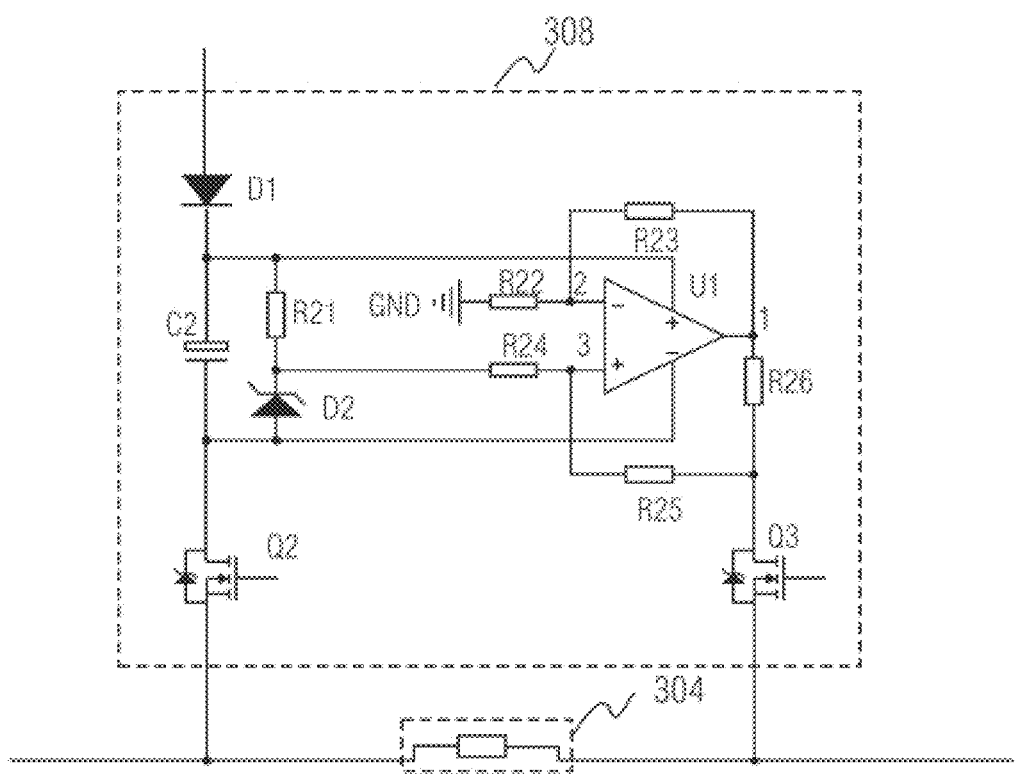
FIG. 11 is a first demonstrative circuit diagram of the voltage control current source of an embodiment of the present invention.

The voltage control current source can be realized by more than one particular method of implementation. FIG. 11 is a first demonstrative circuit diagram of the voltage control current source of the present invention.

In FIG. 11, the diode D2 is a bandgap voltage reference chip having temperature compensation, with very small stable value temperature drift (if further consideration is given to cost, a bandgap reference voltage in the control module 305 can also be shared). Current limiting by a current-limiting resistor R21 ensures that the bandgap voltage reference chip operates in a normal mode, with a stable value of Vref.

When the resistance values of a resistor R22, a resistor R23, a resistor R24 and a resistor R25 are equal, resistor R22 is much greater than a resistor R26 and the third switch Q3 is ON, then a common-end voltage of resistor R25 and resistor R26 is approximately equal to 0 volts, thus an output voltage U1 of the voltage control current source (including a power amplifier and peripheral circuitry thereof) has the following equation: $U1=[Vref*R25/(R24+R25)]*(R22+R23)/R22=Vref$. Thus: a voltage difference arising across resistor R26 set for the output current is equal to Vref. A current flowing through resistor R26 is Iout, wherein $Iout=Vref/R26$. It must be pointed out that: if resistor R22, resistor R23, resistor R24 and resistor R25 are of the same type, then the effects of temperature and lifespan can be mutually compensated, thus reducing the effect of resistance on the long-term uniformity of this circuit.

In one embodiment, an input voltage of the voltage control current source can be altered dynamically, e.g. using a DA interface of the control module, multiple different self-calibration currents can be outputted, which is beneficial for a sampling circuit with zero-point drift.

Figure 12:
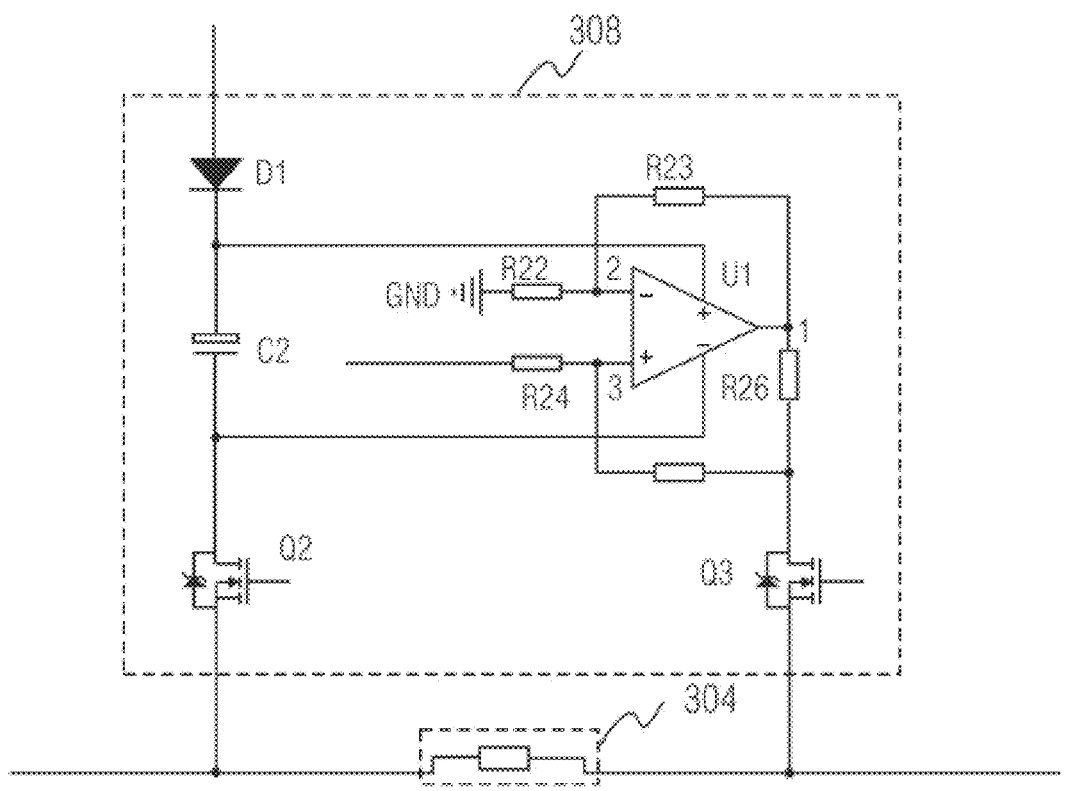
FIG. 12 is a second demonstrative circuit diagram of the voltage control current source of an embodiment of the present invention.

FIG. 12 is a second demonstrative circuit diagram of the voltage control current source of a embodiment of the present invention.

In FIG. 11, if the impedance of the current sensor module 304 is 0.5 ohms and an output voltage of 5 millivolts (mV) must be produced in order to calibrate the circuit, then the output current of the voltage control current source must be 10 milliamps (mA). Thus, the following selection can be made: Vref=1 V, resistor R26 is 100 ohms, and the resistance values of resistors R22, R23, R24 and R25 are equal and greater than 10 kiloohms; and 10 kiloohms is much greater than the resistance value of resistor R26. The value of resistor R21 can be sufficiently large, within the stable range of diode D2, to reduce consumption of the energy of capacitor C2, such that the energy of capacitor C2 is to the maximum extent provided for the voltage control current source U1 output.

The value of capacitor C2 must be determined jointly according to a capacitor discharge voltage range and a required current and time of the power amplifier. If the capacitor discharge voltage range is 9-6 V (i.e Ustart=9; Ustop=6) and the power amplifier U1 output is 10 mA and 500 milliseconds (mS), the U1 output energy is W, wherein W=(Iout)2*(R26+0.5)*t=10 mA2*(100+0.5)*500 mS=5.025 mJ. Then C2>W*2/(Ustart2−Ustop2)=5.025 mJ*2/(81−36)=233.3 uF. It is very easy to find electronic components conforming to the parameters above.

It must be explained that not all of the steps and modules in the flows and structural diagrams above are necessary; certain steps or modules may be omitted according to actual requirements. The order in which steps are executed is not fixed, but may be adjusted as required. The partitioning of the modules is merely functional partitioning, employed for the purpose of facilitating description; during actual implementation, one module may be realized by multiple modules, and the functions of multiple modules may be realized by the same module; these modules may be located in the same device, or in different devices.

Hardware modules in the embodiments may be realized mechanically or electronically. For example, one hardware module may comprise a specially designed permanent circuit or logic device (such as a dedicated processor, such as an FPGA or ASIC) for completing a specific operation. The hardware module may also comprise a programmable logic device or circuit that is temporarily configured by software (e.g. comprising a general processor or another programmable processor) for executing a specific operation. The choice of whether to specifically use a mechanical method, or a dedicated permanent circuit, or a temporarily configured circuit (e.g. configured by software) to realize the hardware module can be decided according to considerations of cost and time.

The present invention has been displayed and explained in detail above by way of the accompanying drawings and preferred embodiments, but the present invention is not limited to these disclosed embodiments. Based on the embodiments described above, those skilled in the art will know that further embodiments of the present invention, also falling within the scope of protection of the present invention, could be obtained by combining code checking device(s) in different embodiments above.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A current sensor unit, comprising:
a rectification module, configured to convert an AC current to a pulsed DC current;
a power source conversion module including an energy storage element, the power source conversion module connected to the rectification module, configured to store energy for the energy storage element based upon the pulsed DC current during operation in a charging mode and configured to generate a power supply current based upon a voltage of the energy storage element;
a mode switching module connected to the rectification module, the mode switching module configured to be bypassed by the power source conversion module during operation in the charging mode, and configured to bypass the power source conversion module during operation in an energy release mode;
a current sensor module, an output of the current sensor module connected to the rectification module and an input of the current sensor module connected to the power source conversion module and the mode switching module, separately, the current sensor module configured to detect a pulsed DC current flowing back from the power source conversion module or a pulsed DC current flowing back from the mode switching module;
a control module, configured to
acquire electrical energy from the power supply current,
determine that operation is in the charging mode or the energy release mode based upon the voltage of the energy storage element, and
acquire a first detection value provided by the current sensor module and relating to a pulsed DC current; and
a self-calibration module configured to generate a current flowing through the current sensor module in a self-calibration process;
wherein the current sensor module is further configured to detect the current flowing through the current sensor module in the self-calibration process; and
wherein the control module is further configured to calibrate the first detection value based on a second detection value provided by the current sensor module and relating to the current flowing through the current sensor module in the self-calibration process.

2. The current sensor unit of claim 1, further comprising:
a signal conditioning module arranged between the current sensor module and the control module, the signal conditioning module configured to acquire electrical energy from the power supply current, and to condition the first detection value and the second detection value.

3. The current sensor unit of claim 1, wherein the control module is configured to
    determine that operation is in the energy release mode upon the voltage of the energy storage element being greater than or equal to a first value, and
    determine that operation is in the charging mode upon the voltage of the energy storage element being lower than or equal to a second value, the first value being greater than the second value.

4. The current sensor unit of claim 2, wherein the control module is configured to calculate a calibration factor based upon the second detection value and a theoretical value of the current flowing through the current sensor module in the self-calibration process, and is configured to calibrate the first detection value based on the calibration factor.

5. The current sensor unit of claim 4, wherein the control module is further configured to abandon a calibration factor greater than a first threshold or less than a second threshold, the first threshold being greater than the second threshold.

6. The current sensor unit of claim 1, wherein the self-calibration module comprises:
    a first switch;
    a diode, an anode of the diode being connected to the rectification module;
    a capacitor, a first end of the capacitor being connected to a cathode of the diode;
    a second switch connected to a second end of the capacitor;
    a voltage control current source connected in parallel with the capacitor; and
    a third switch arranged between the voltage control current source and the current sensor module.

7. The current sensor unit of claim 1, wherein the rectification module includes
    a full-bridge rectification circuit or a half-bridge rectification circuit, and
    a transient voltage suppression element connected in parallel with the full-bridge rectification circuit or the half-bridge rectification circuit.

8. A current detection circuit, comprising:
    a current transformer including a primary-side circuit and a secondary-side circuit; and
    a current sensor unit connected to an output terminal of the secondary-side circuit, the current sensor unit including
        a rectification module configured to convert an AC current output by the secondary-side circuit, via the output terminal, to a pulsed DC current;
        a power source conversion module including an energy storage element, the power source conversion module connected to the rectification module, configured to store energy for the energy storage element based upon the pulsed DC current during operation in a charging mode, and configured to generate a power supply current based on a voltage of the energy storage element;
        a mode switching module connected to the rectification module, the mode switching module configured to be bypassed by the power source conversion module during operation in the charging mode, and configured to bypass the power source conversion module during operation in an energy release mode;
        a current sensor module, an output of the current sensor module connected to the rectification module and an input of the current sensor module connected to the power source conversion module and the mode switching module, separately, the current sensor nodule configured to detect a pulsed DC current flowing back from the power source conversion module or a pulsed DC current flowing back from the mode switching module;
        a control module, configured to
            acquire electrical energy from a power supply current,
            determine that operation is in the charging mode or the energy release mode based on the voltage of the energy storage element, and
            acquire a first detection value provided by the current sensor module and relating to a pulsed DC current;
        a self-calibration module, configured to generate a current flowing through the current sensor module in a self-calibration process;
        wherein the current sensor module is further configured to detect the current flowing through the current sensor module in the self-calibration process; and
        wherein the control module is further configured to calibrate the first detection value based on a second detection value, provided by the current sensor module and relating to the current flowing through the current sensor module in the self-calibration process.

9. The current detection circuit of claim 8, wherein the self-calibration module comprises:
    a first switch;
    a diode, an anode of the diode being connected to the rectification module;
    a capacitor, a first end of the capacitor being connected to a cathode of the diode;
    a second switch connected to a second end of the capacitor;
    a voltage control current source connected in parallel with the capacitor; and
    a third switch arranged between the voltage control current source and the current sensor module.

10. The current detection circuit of claim 8, wherein the control module is configured to calculate a calibration factor based on the second detection value and a theoretical value of the current flowing through the current sensor module in the self-calibration process, and to calibrate the first detection value based on the calibration factor.

11. The current sensor unit of claim 2, wherein the rectification module includes
    a full-bridge rectification circuit or a half-bridge rectification circuit, and
    a transient voltage suppression element connected in parallel with the full-bridge rectification circuit or the half-bridge rectification circuit.

12. The current sensor unit of claim 3, wherein the rectification module includes
    a full-bridge rectification circuit or a half-bridge rectification circuit, and
    a transient voltage suppression element connected in parallel with the full-bridge rectification circuit or the half-bridge rectification circuit.

13. The current sensor unit of claim 4, wherein the rectification module includes
    a full-bridge rectification circuit or a half-bridge rectification circuit, and
    a transient voltage suppression element connected in parallel with the full-bridge rectification circuit or the half-bridge rectification circuit.

14. A current sensor unit, comprising:
    a rectification module, configured to convert an AC current to a pulsed DC current;

a power source conversion module including an energy storage element, the power source conversion module connected to the rectification module, configured to store energy for the energy storage element based upon the pulsed DC current during operation in a charging mode and configured to generate a power supply current based upon a voltage of the energy storage element;

a mode switching module connected to the rectification module, the mode switching module configured to be bypassed by the power source conversion module during operation in the charging mode, and configured to bypass the power source conversion module during operation in an energy release mode;

a current sensor module connected to the rectification module, the power source conversion module and the mode switching module, separately, and the current sensor module configured to detect a pulsed DC current flowing back from the power source conversion module or a pulsed DC current flowing back from the mode switching module;

a control module, configured to
  acquire electrical energy from the power supply current,
  determine that operation is in the charging mode or the energy release mode based upon the voltage of the energy storage element, and
  acquire a first detection value provided by the current sensor module and relating to a pulsed DC current; and a self-calibration module configured to generate a current flowing through the current sensor module in a self-calibration process; wherein
  the current sensor module is further configured to detect the current flowing through the current sensor module in the self-calibration process, and
  the control module is further configured to calibrate the first detection value based on a second detection value provided by the current sensor module and relating to the current flowing through the current sensor module in the self-calibration process;

wherein
  the control module is configured to calculate a calibration factor based upon the second detection value and a theoretical value of the current flowing through the current sensor module in the self-calibration process, and is configured to calibrate the first detection value based on the calibration factor.

15. A current sensor unit, comprising:

a rectification module, configured to convert an AC current to a pulsed DC current;

a power source conversion module including an energy storage element, the power source conversion module connected to the rectification module, configured to store energy for the energy storage element based upon the pulsed DC current during operation in a charging mode and configured to generate a power supply current based upon a voltage of the energy storage element;

a mode switching module connected to the rectification module, the mode switching module configured to be bypassed by the power source conversion module during operation in the charging mode, and configured to bypass the power source conversion module during operation in an energy release mode;

a current sensor module connected to the rectification module, the power source conversion module and the mode switching module, separately, and the current sensor module configured to detect a pulsed DC current flowing back from the power source conversion module or a pulsed DC current flowing back from the mode switching module;

a control module, configured to
  acquire electrical energy from the power supply current,
  determine that operation is in the charging mode or the energy release mode based upon the voltage of the energy storage element, and
  acquire a first detection value provided by the current sensor module and relating to a pulsed DC current; and a self-calibration module configured to generate a current flowing through the current sensor module in a self-calibration process;

wherein the current sensor module is further configured to detect the current flowing through the current sensor module in the self-calibration process;

wherein the control module is further configured to calibrate the first detection value based on a second detection value provided by the current sensor module and relating to the current flowing through the current sensor module in the self-calibration process; and wherein the self-calibration module includes
  a first switch,
  a diode, an anode of the diode being connected to the rectification module,
  a capacitor, a first end of the capacitor being connected to a cathode of the diode,
  a second switch connected to a second end of the capacitor,
  a voltage control current source connected in parallel with the capacitor, and
  a third switch arranged between the voltage control current source and the current sensor module.

* * * * *